United States Patent [19]
Choi et al.

[11] Patent Number: 5,208,175
[45] Date of Patent: May 4, 1993

[54] METHOD OF MAKING A NONVOLATILE SEMICONDUCTOR MEMORY DEVICE

[75] Inventors: Jeong-hyeok Choi, Seoul; Geon-su Kim; Yun-seong Sin, both of Kyunggi, all of Rep. of Korea

[73] Assignee: Samsung Electronics Co., Ltd., Kyunggi, Rep. of Korea

[21] Appl. No.: 692,210

[22] Filed: Apr. 26, 1991

[30] Foreign Application Priority Data

Dec. 21, 1990 [KR] Rep. of Korea ............... 90-21387

[51] Int. Cl.$^5$ ............................................. H01L 21/70
[52] U.S. Cl. ...................................... 437/43; 437/48; 437/52; 437/195; 437/233; 437/238; 437/44
[58] Field of Search .................... 437/43, 48, 52, 195, 437/228, 233, 235, 238; 337/235

[56] References Cited

U.S. PATENT DOCUMENTS

| | | | |
|---|---|---|---|
| 4,635,347 | 1/1987 | Liem et al. | 437/43 |
| 4,804,637 | 2/1989 | Smayling et al. | 437/43 |
| 4,888,293 | 12/1989 | Rivaud et al. | 437/43 |
| 5,019,879 | 5/1991 | Chiu | 437/43 |

FOREIGN PATENT DOCUMENTS

| | | |
|---|---|---|
| 0072061 | 5/1980 | Japan . |
| 0049570 | 5/1981 | Japan ................... 437/48 |
| 0161673 | 12/1981 | Japan . |
| 0048439 | 3/1983 | Japan . |
| 0050771 | 3/1983 | Japan . |
| 0158970 | 9/1983 | Japan . |
| 0081947 | 4/1988 | Japan . |
| 0284473 | 11/1990 | Japan . |

Primary Examiner—Tom Thomas
Attorney, Agent, or Firm—Morgan & Finnegan

[57] ABSTRACT

A nonvolatile semiconductor memory device and the method thereof is disclosed. The nonvolatile semiconductor memory device comprises a first conductive type semiconductor substrate, a field oxide film formed on the semiconductor substrate to define an active region, a source region and a drain region which are separated by a channel region near the surface of semiconductor substrate of the active region and diffused with an impurity of the opposite conductive type to the semiconductor substrate, a thin gate insulating film formed on the channel region and partially on the source and drain regions, a first conductive layer formed on the gate insulating film and provided as a floating electrode for accumulating charges, an interlayer insulating film formed on the first conductive layer, and a second conductive layer formed on the interlayer insulating film and provided as a control electrode. In the nonvolatile semiconductor memory device, cell characteristics can be greatly improved by thickening the exposed edge of the gate insulating film damaged during fabrication by the reoxidation process, after the formation of the patterns of the floating gate electrode and the control gate electrode.

4 Claims, 4 Drawing Sheets

METHOD OF MAKING A NONVOLATILE SEMICONDUCTOR MEMORY DEVICE

BACKGROUND OF THE INVENTION

The present invention relates to a nonvolatile semiconductor memory device and a manufacturing method thereof, and more particularly to a nonvolatile semiconductor memory device and a manufacturing method thereof which improves data retention.

In general, a nonvolatile semiconductor memory of the floating gate type includes an electrically insulated floating gate electrode underneath the control gate electrode, and charges are induced into the floating gate electrode to be retained as stored information. In the nonvolatile semiconductor memory of the floating gate type, when information is written or erased, a strong electric field is applied to the thin gate oxide film under the floating gate electrode, and charges are injected into or emitted from the floating gate electrode through the thin gate oxide film. Thus, the endurance in the writing and erasing of the information depends on the electric field of the gate oxide film formed under the floating gate electrode.

Such floating gate type nonvolatile semiconductor memories include EPROMs, EEPROMs, flash EEPROMs, etc. FIG. 1 shows a cross-sectional view of a conventional semiconductor memory cell structure of the typical floating gate type. In the cell shown in FIG. 1, a source region 9a and a drain region 9b, doped with an n+ impurity near the surface of a p-type silicon substrate 1, are separated from each other by a channel region. A thin gate oxide film 3 is formed on the channel region and is partially on both the source region 9a and the drain region 9b. The first conductive layer 4, which is provided as a floating gate electrode, the insulating film 5, and the second conductive, which is layer 6 provided as a control gate electrode are formed on the gate oxide film 3. To write information in an EPROM having such a cell structure, high voltages of 12.5 V and 7 to 8 V are respectively supplied to the control gate electrode and the drain region, thereby generating an electric field in the floating gate electrode and accelerating electrons in the pinch-off region on the drain region side and causing them to be injected into the floating gate electrode. When an ultraviolet ray is irradiated to erase the information, the injected electrons are emitted to initialize the memory cell. However, in a EEPROM, if a high voltage (about +20 V) is supplied to a control gate electrode with the drain grounded, electrons are injected into the floating gate electrode through a thin gate oxide film. Conversely, if the voltage is supplied to the drain with the control gate electrode grounded, electrons are emitted through the thin gate oxide film from the floating gate electrode. As described above, the injection and the emission of the electrons are carried out through the gate oxide film, resulting in a variation of the threshold voltage in the channel region, thereby obtaining the nonvolatile information memory function.

In a conventional nonvolatile semiconductor memory of the floating gate type, since the injection and the emission of the electrons are carried out by a hot electron or tunneling effect, a thin gate oxide film should be formed to effectively carry out the injection and the emission of the electrons. Conventionally, an EPROM has a thickness of approximately 300 Å and a EEPROM has a thickness of 100 Å.

In such conventional nonvolatile semiconductor memories of the floating gate type, the electrons injected into the floating gate electrode when writing information are enclosed by the potential barrier resulting from the surrounding insulating film, hence stored. However, if the surrounding insulating film is damaged during the fabrication process or has a defect, the injected electrons leak through the damaged or defected portion. Electron leakage from the floating gate electrode deteriorates the reliability of the memory device.

To determine the main reason for this electron leakage, the information is stored in two samples having an interlayer insulating film thickness of 400 Å and 600 Å. Then the samples are baked for 48 hours at 200° C. The variation in threshold voltage Vt is checked at 12 hour intervals and the result is obtained as a graphic diagram shown in FIG. 2, which shows that regardless of the interlayer insulating film thickness, the initial threshold voltages Vt of both samples decrease from +4 V to approximately +2 V over 48 hours. Therefore, the electron leakage of the floating gate electrode is not related to the thickness of the interlayer insulating film, and mainly occurs through the thin gate oxide film.

In the conventional cell structure shown in FIG. 1, a thin gate oxide film 3, a first conductive layer 4, an interlayer insulating film 5, and a second conductive layer 6 are sequentially stacked on a silicon substrate 1, and the second conductive layer 6, the interlayer insulating film 5, and the first conductive layer 4 are sequentially etched to form a stacked floating gate electrode and control gate electrode. At this time, if the etching is excessive, the edges of the gate oxide film 3 under the floating gate electrode 4 are also etched somewhat, or the exposed edges of the gate oxide film 3 receive an impulse and are then damaged by the responsive ions during reactive ion etching. Accordingly, the exposed edges of the gate oxide film 3 are damaged during the fabrication process, which causes the majority of electron leakage.

Specifically, in the case of flash EEPROMs, the gate oxide film is about 100 Å thick, and in highly integrated devices, in the megabit region or more, the thickness of the insulating film is further decreased, so it is highly desirable to solve the problem of the data loss by electron leakage.

SUMMARY OF THE INVENTION

It is an object of the present invention to provide a nonvolatile semiconductor memory device which can improve the data retention property by improving the gate oxide film, to solve the above problems.

It is another object of the present invention to provide the most suitable method for manufacturing the nonvolatile semiconductor memory device.

To achieve the above objects, the nonvolatile semiconductor memory device comprises:

a semiconductor substrate of a first conductive type;

a field oxide film formed to define an active region on the semiconductor substrate;

a source region and a drain region, separated from each other by the channel region, near the surface of the semiconductor substrate of the active region and diffused with impurities of the opposite conductive type to the semiconductor substrate;

a thin gate insulating film formed on the channel region, part on the source region and part on the drain region;

a first conductive layer formed on the gate insulating film and provided as a floating electrode for accumulating charges;

an interlayer insulating film formed on the first conductive layer; and a second conductive layer formed on the interlayer insulating film and provided as a control electrode, wherein the thickness of the edge of the thin gate insulating film is thicker than that of portions other than the edge.

Thus, since the edge of the gate oxide film is formed as a thick film, preventing electron leakage, this improves the data retention property.

To achieve another object, the manufacturing method of the present invention comprises the steps of:

forming a field oxide film to define an active region on a first conductive type semiconductor substrate;

thermally growing a thin gate oxide film on the surface of the semiconductor substrate of the active region;

depositing a first polycrystalline silicon doped with an impurity on the thin gate oxide film to form a pattern of the first polycrystalline silicon deposited by a conventional photolithography process;

covering the first patterned polycrystalline silicon layer with an interlayer insulating film;

forming a pattern of a first polycrystalline silicon layer provided as a floating electrode for accumulating charges and a pattern of an impurity-doped second polycrystalline silicon layer overlapping the floating electrode and provided as a control electrode by depositing the second polycrystalline silicon layer on the interlayer insulating film and sequentially etching the stacked layers of the second polycrystalline silicon layer, the interlayer insulating film, and the first polycrystalline silicon layer;

growing a thermal oxide film having a thickness at least two times as thick as that of the thin gate oxide film on the whole surface of the above resultant structure, after the step of forming the patterns;

thinly forming the thickness of the thermal oxide film formed on the surface of the active region by etching the thermal oxide film by an anisotropically etching process, after the step of growing the thermal oxide film; and implanting ions of the impurity having the opposite conductive type of the substrate and then forming a source region and a drain region, whereby the edge of the thin gate oxide film is thickly formed by the bird's beak extending toward the active region from the thermal oxide film.

Also, in the above-described manufacturing method, the step of ion-implantation can be carried out first, and then the growth of the thermal oxide film can be carried out later.

BRIEF DESCRIPTION OF THE DRAWINGS

The above objects and other advantages of the present invention will become more apparent by describing the preferred embodiments of the present invention with reference to the attached drawings, in which.

DETAILED DESCRIPTION OF THE INVENTION

Figure 1:
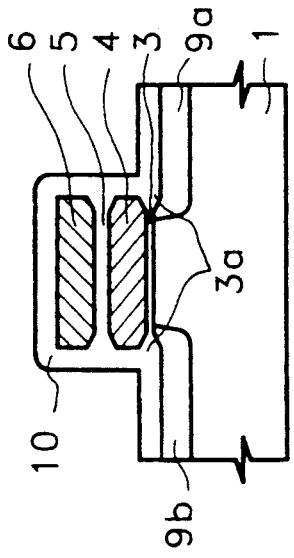
FIG. 1 is a cross-sectional view of the conventional stacked type flash EEPROM cell.
Figure 3:
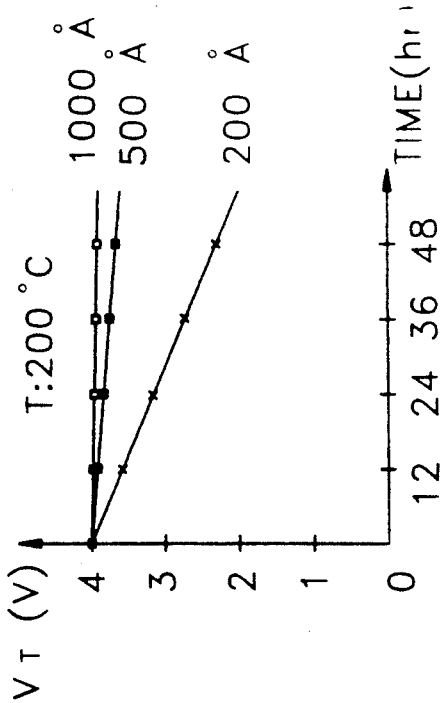
FIG. 3 is a cross-sectional view of a stacked type flash EEPROM cell according to the present invention.
Figure 2:
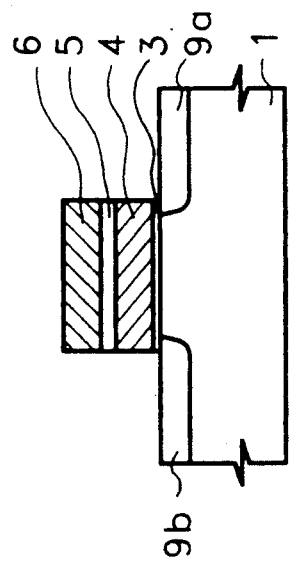
FIG. 2 is a graphical representation showing the characteristic variation of time versus the threshold voltage Vt according to the oxide film thickness of the interlayer gate of the conventional stacked type flash EEPROM cell.

Referring to FIG. 3, in a cell structure of a floating gate type nonvolatile semiconductor memory device according to the present invention, a source region 9a doped with n+ impurities and a drain region 9b on a p-type semiconductor substrate 1 are separated by a channel region. A gate insulating film 3, for instance, an oxide film of approximately 100 Å, is formed over the channel region, part of source region 9a, and part of drain region 9b. A first conductive layer 4 for a floating gate electrode, interlayer insulating film 5 and a second conductive layer 6 for a control gate electrode are stacked on the gate insulating film 3, whereby the cell is formed by depositing a thermal oxide film 10 at least two times as thick as the gate insulating film 3 on the surface of the above structure. When the thermal oxide film 10 is grown, the bird's beak extending toward and connected to the active region of the gate insulating film 3, from the thermal oxide film, is provided as a thick film 3a of the gate insulating film 3. Thus, even if the exposed edge part of the gate insulating film 3 is damaged, the formation of the thick film 3a compensates for, thereby preventing electron leakage.

Figure 4:
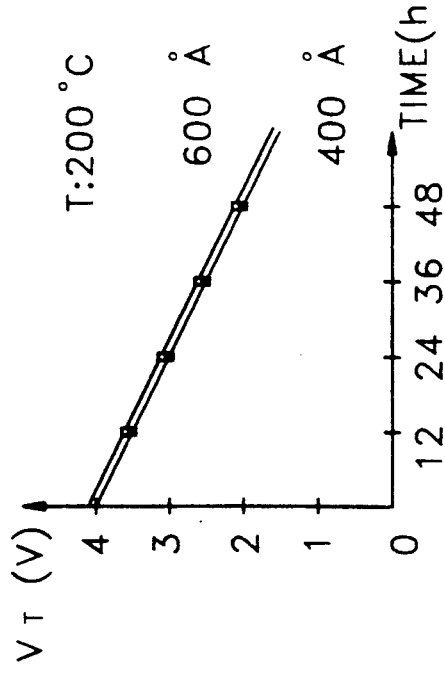
FIG. 4 is a graphical representation of the characteristic variation of time versus threshold voltage Vt according to the thermal oxide thickness of the stacked type flash EEPROM cell according to the present invention at 200° C.

Referring to FIG. 4, to test the cell structure reliability according to the present invention, for samples having thickness of 200 Å, 500 Å, and 1,000 Å as the thermal oxide film 10, a high voltage of +20 V is supplied to the second conductive layers 6, and then the source regions 9a, the drain regions 9b, and the substrates 1 are grounded. Electrons are injected into the first conductive layers 4, e.g., the floating gate electrodes for 100 mS. Then, the samples are baked in a furnace at 200° C. for 48 hours. The threshold voltage Vt of each sample is measured every 12 hours and the graphic diagram obtained is shown in FIG. 4, showing that when the thermal oxide film of 200 Å is formed, the decreasing characteristic of the threshold voltage is similar to the conventional cell structure represented. However, in cases of the 500 Å and 1,000 Å samples, it is shown that the decrease in threshold voltage is remarkably reduced. As for the 1,000 Å sample, a threshold voltage nearly that of the initial state is maintained even after 48 hours.

Now, the manufacturing method of the above-described present invention will be disclosed.

Figure 5:
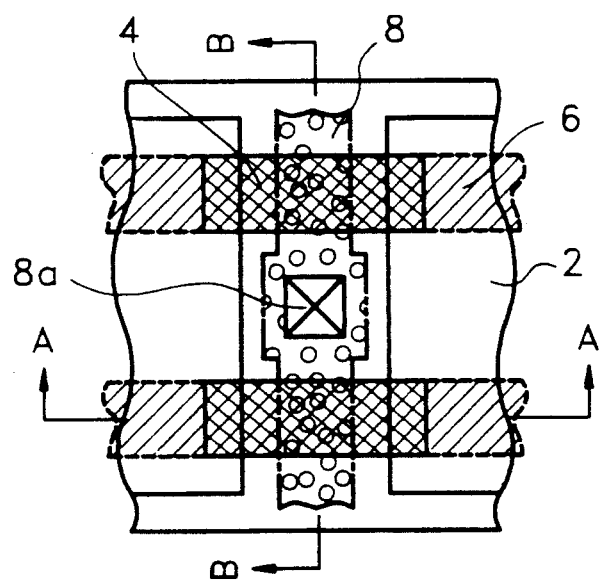
FIG. 5 is a planar layout diagram of the stacked type flash EEPROM cell array according to the present invention.
Figure 6:
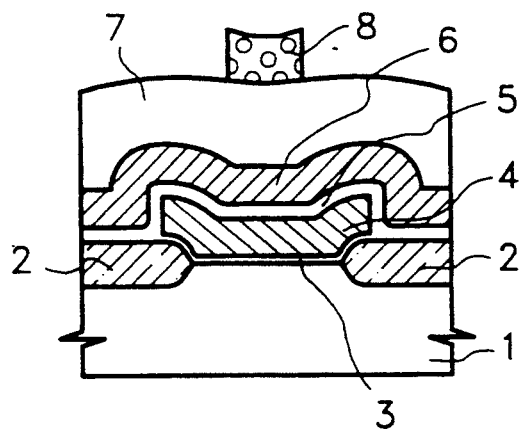
FIG. 6 is a cross-sectional view taken on line A—A of FIG. 5.
Figure 7:
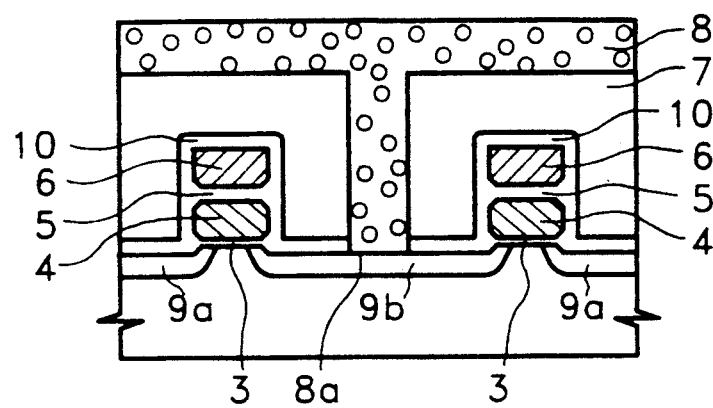
FIG. 7 is a cross-sectional view taken on line B—B of FIG. 5.

FIG. 5 is a planar lay-out diagram of a nonvolatile semiconductor memory device according to the present invention, FIG. 6 is a sectional view taken on line A—A of FIG. 5, and FIG. 7 is a sectional view taken on line B—B of FIG. 5. In these drawings, the corresponding cell structure elements use the same reference numerals as their like elements shown in FIG. 3. The numeral 2 in FIG. 5 indicates a field oxide film formed on an isolation region in the sectional view of FIG. 6. In FIGS. 6 and 7, the numeral 7 indicates a surface protecting layer for planarizing the surfaces such as a BPSG film, a SOG film, etc., and the numeral 8 indicates a metallic electrode provided as a bit line which contacts the drain region 9b through the contact hole 8a.

With reference to FIG. 8A through FIG. 8D, a preferred embodiment of a manufacturing method for a nonvolatile semiconductor memory according to the present invention will be described.

First, to form a transistor in a region of a peripheral circuit part of a p-type silicon wafer substrate 1 using a CMOS technique, a pad oxide film is grown, and the part of the pad oxide film corresponding to n-well region is then etched and removed. Successively, p+ ions of an n-type impurity are injected into the portion in which a pad oxide film has been removed, with a density of 4.5E12 ions/cm² at an energy level of 150 KeV, and are heated for 10 hours at 1,000° C. to activate the impurity to form an n-well. The pad oxide film is completely removed and the pad oxide film is grown to be a thickness of 380 Å, on which the nitride film of 1,500 Å is deposited. The part corresponding to the isolation region of the nitride film is removed by a dry method and a photoresist is covered on the n-well region. Successively, with the nitride film and the photoresist film as a mask, the boric acid ions of p-type impurity are injected with a density of 5.0E13 ions/cm² at 30 KeV, and the photoresist is removed, and the field oxide film is grown to a thickness of approximately 8,000 Å. Successively, the nitride film and the pad oxide film are completely removed. A gate oxide film of approximately 300 Å is formed in the active region, and the boron ions are injected with 5.0E11 ions/cm² at 30 KeV to control the threshold voltage of the transistor in the active region of the peripheral circuit part. After the boron ions are injected with 2.0E12 ions/cm² at 30 KeV energy to control the cell threshold voltage in the active region of the memory cell part, the gate oxide film is removed and the thin gate insulating film 3 is grown to an oxide film of 100 Å. After that, the first polycrystalline silicon, provided as a floating gate electrode of the memory cell part and the transistor gate electrode of the peripheral circuit part, is deposited to a thickness of 2,000 Å using an LPCVD method. Successively, to reduce the resistance of the deposited polycrystalline silicon, POCl₃ is used to dope the impurity. Successively, the first polycrystalline silicon layer is patterned using a conventional photolithography process. Then, the first polycrystalline silicon layer of the memory cell part is covered with an interlayer insulating film 5 such as an O/N/O film. After the first oxide film of the O/N/O film is deposited to a thickness of 160 Å and the nitride film is deposited to a thickness of 200 Å, the second oxide film is processed at 1,000° C. for ten minutes in a wet oxygen O₂ atmosphere to form a thermal oxide film of 40 Å which is the thickness of an oxide film grown on the nitride film. Then, to form the gate of the peripheral circuit, the peripheral circuit is defined by a photoresist process, and then the O/N/O film of the peripheral circuit is removed by the etching process, and then the gate oxide film is grown to a thickness of 400 Å. At this time, the growth of the oxide film is restrained in the region covered with the O/N/O film. Successively, to provide the control gate electrode of the memory cell part and the polystructure of the peripheral circuit part, the second polycrystalline silicon is deposited to a thickness of 4,000 Å and the impurity is doped by applying POCl₃ in the second polycrystalline silicon layer to decrease its resistance. Accordingly, the memory cell part obtains a structure having the cross-section shown in FIG. 8A. To further decrease the resistance of the second polycrystalline silicon layer, a silicide film having a high melting point such as tungsten can be stacked.

Figure 8A:
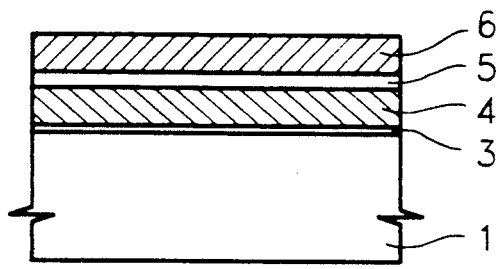
FIGS. 8A to 8D are cross-sectional views showing a first embodiment of the fabrication process sequence of the stacked type flash EEPROM according to the present invention.
Figure 8B:
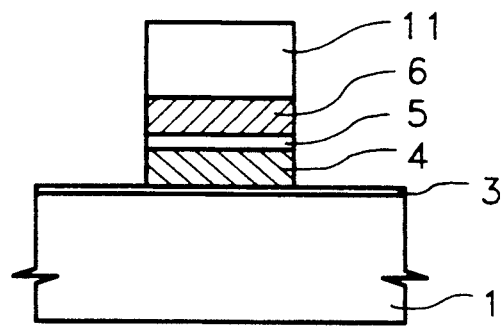

After the above process, the polycrystalline silicon pattern of the peripheral circuit part is formed, and a pattern is formed in the memory cell part with the photoresist 11 by a conventional photolithography process. The second polycrystalline silicon layer, the interlayer insulating film of an O/N/O structure, and the first polycrystalline silicon layer are sequentially etched with the pattern of the photoresist 11 as a mask, completing the memory cell. FIG. 8B shows a cross-sectional view of the stacked structure of the second conductive layer 6 for a control gate electrode, the interlayer insulating film 5, and the first conductive layer 4 for a floating gate electrode, obtained by the etching process.

Figure 8C:
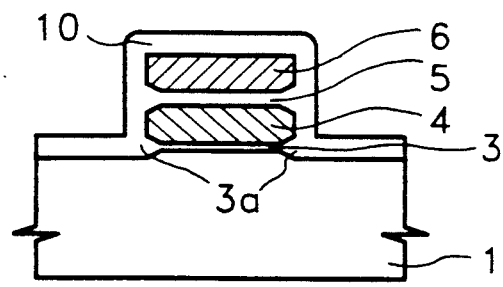

Then, the above resultant structure is placed in a furnace and processed for 15 minutes in a wet oxygen O₂ atmosphere to grow a thermal oxide film of 10 to 1,000 Å thickness along the whole surface. Accordingly, the bird's beak extending toward the edges of the gate insulating film 3 from the thermal oxide film 10 provides a thick film 3a around the edge of the floating gate 3 as shown in FIG. 8C.

Figure 8D:
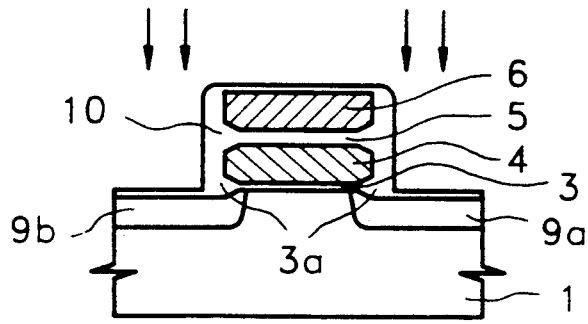

Successively, the 1,000 Å thermal oxide film 10 is anisotropically etched by a responsive ion etching method to remove approximately 600 Å of the oxide film, thinning the portion of the thermal oxide film 10 on which the source region and the drain region will be formed. And then, the arsenic ions of the n+ type impurity are injected with a density of 6.0E15 ions/cm² at 150 KeV through the thinned oxide film. A heating process is then carried out for 20 minutes at 975° C., forming the n+ source region 9a and n+ drain region 9b near the surface of substrate 1 as shown in FIG. 8D. Thus, the cell structure according to the present invention is obtained.

After that, to form a source and a drain of a transistor in the n-well region of the peripheral circuit part, boron ions are injected with a density of 2.0E15 ions/cm² at 40 KeV, and a LTO film of the 1,700 Å thickness and a BPSG film of 7,000 Å thickness on the whole surface are sequentially etched. The BPSG film is then reflowed for 30 minutes in an N₂ atmosphere to roughly planarize the surface, forming the surface protecting layer 7.

Afterwards, a metal contact hole is formed. A pattern of 1 μm-thick metal is deposited, completing the metal wiring. After that, the contact between the metal in the contact hole and the active region forms an ohmic contact through an alloy process.

Figure 9A:
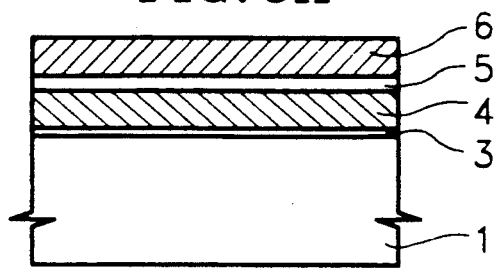
FIGS. 9A to 9D are cross-sectional views showing a second preferred embodiment of the fabrication process sequence of the stacked type flash EEPROM according to the present invention.
Figure 9B:
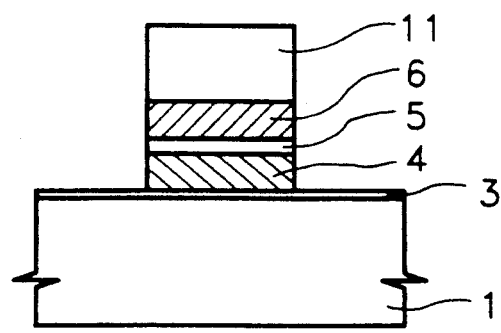

FIG. 9A through FIG. 9D are cross-sectional views showing a second embodiment of the fabrication method of a nonvolatile semiconductor memory device having the cell structure according to the present invention. The process shown in FIGS. 9A and 9B is identical with that of FIGS. 8A and 8B in the first embodiment.

Figure 9C:
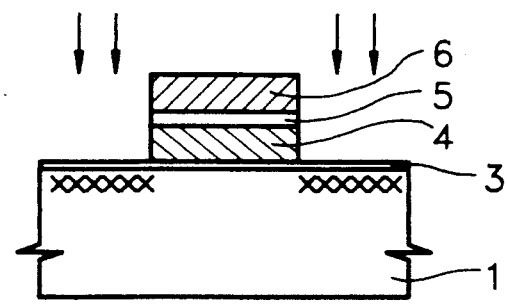

In the second preferred embodiment shown in FIG. 9C, the stacked structure of the first conductive layer 4, the interlayer insulating film 5, and the second conductive layer 6 is formed, and arsenic ions are injected with a density of 6.0E15 ions/cm$^2$ at 75 KeV through the thin gate insulating film 3.

Figure 9D:
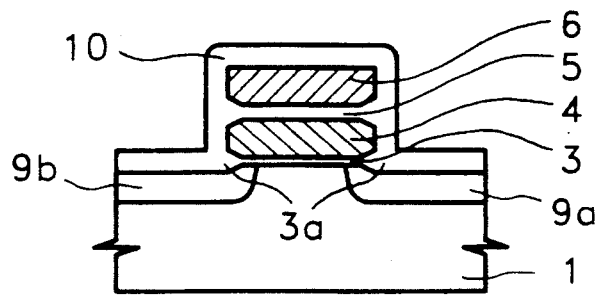

Referring to FIG. 9D, after the injection process, a wet $O_2$ atmosphere is applied at 975° C. for 7 minutes, and then a dry atmosphere is applied for 23 minutes, thereby growing the thermal oxide film 10 to approximately 1,000 Å thickness. During the growth process of the thermal oxide film, the impurity ions injected near the surface of the substrate 1 are activated, forming the n+ source region 9a and the n+ drain region 9b.

As compared with the first embodiment, the second embodiment carries out the ion injection process first and the thermal oxide film growth process later, benefitting economically by omitting the ion etching process, the drive-in process for activating the injected ions, etc. Also, the ion-injection energy level can be halved.

The present invention as described above prevents the leakage of electrons stored in the floating gate electrode due to environmental conditions such as noise, high temperature, humidity, and pressure, thereby improving data retention. That is, in the nonvolatile semiconductor memory device, a pattern of the floating gate electrode and a pattern of the control gate electrode are formed, and the exposed edge of the active region of the gate insulating film damaged in the fabrication process is thickened, greatly improving cell characteristics. Thus providing a nonvolatile semiconductor memory device of high reliability.

What is claimed is:

1. A method for manufacturing a nonvolatile semiconductor memory device comprising the steps of:
    forming a field oxide film to define an active region on a semiconductor substrate of a first conductive type;
    thermally growing a gate oxide film on the surface of said semiconductor substrate of said active region;
    depositing a first polycrystalline silicon layer doped with an impurity and forming a pattern of said first deposited polycrystalline silicon layer;
    covering said first patterned polycrystalline silicon layer with an interlayer insulating film;
    depositing a second polycrystalline silicon layer on said interlayer insulating film;
    forming a pattern of a first polycrystalline silicon layer provided as a floating electrode for accumulating charges and a pattern of said second polycrystalline silicon layer provided as a control electrode overlapping said floating electrode, by using a photolithography process to sequentially etch the stacked layers of the second polycrystalline silicone layer, the interlayer insulating film, and the first polycrystalline silicon layer;
    growing a thermal oxide film at least two times as thick as that of said gate oxide film on the whole surface of the above resultant structure, after the step of forming said patterns;
    thinning the portion of said thermal oxide film formed on the surface of said active region by an anisotropically etching process, after the step of growing said thermal oxide film; and
    forming a source region and a drain region by ion-implanting impurities of the opposite conductive type to the substrate near the surface of the semiconductor substrate of the active region through said thermal oxide film and then activating the implanted impurities;
    whereby the edge portion of said gate oxide film, which is thicker than the other portions of said gate oxide film, is formed by a bird's beak extending toward said gate oxide film from said thermal oxide film.

2. A method for manufacturing a nonvolatile semiconductor memory device as claimed in claim 1, wherein in the step of growing said thermal oxide film, a wet oxide oxygen atmosphere is held for approximately 15 minutes, thereby growing the thermal oxide film to a thickness of approximately 1,000 Å.

3. A method for manufacturing a nonvolatile semiconductor memory device as claimed in claim 1, wherein said interlayer insulating film is an oxide film, a nitride film, or a stacked film of oxide and nitride.

4. A method for manufacturing a nonvolatile semiconductor memory device comprising the steps of:
    growing a gate oxide film on the an active region of a semiconductor substrate of a first conductivity type;
    depositing a first polycrystalline silicon layer on said gate oxide film;
    covering said first polycrystalline silicon layer with an interlayer insulating layer;
    depositing a second polycrystalline silicon layer on said interlayer insulating film;
    forming a pattern of said first polycrystalline silicon layer as a floating electrode for accumulating charges and a pattern of said second polycrystalline silicon layer provided as a control electrode overlapping said floating electrode;
    growing a thermal oxide film on the whole surface of the above resultant structure; and
    thinning a portion of said thermal oxide film formed on said active region after the step of growing said thermal oxide film; introducing a seconductivity type impurity through the thinned thermal oxide film to form source and drain regions.

* * * * *